United States Patent
Xu et al.

(10) Patent No.: US 9,341,921 B2
(45) Date of Patent: May 17, 2016

(54) TERAHERTZ ANALOG-TO-DIGITAL CONVERTER EMPLOYING ACTIVE-CONTROLLED SPOOFED SURFACE PLASMON POLARITON ARCHITECTURE

(71) Applicant: The Regents of The University of Michigan, Ann Arbor, MI (US)

(72) Inventors: Zhao Xu, Ann Arbor, MI (US); Pinaki Mazumder, Ann Arbor, MI (US)

(73) Assignee: The Regents Of The University Of Michigan, Ann Arbor, MI (US)

( * ) Notice: Subject to any disclaimer, the term of this patent is extended or adjusted under 35 U.S.C. 154(b) by 35 days.

(21) Appl. No.: 14/317,015

(22) Filed: Jun. 27, 2014

(65) Prior Publication Data
US 2015/0323852 A1    Nov. 12, 2015

Related U.S. Application Data

(60) Provisional application No. 61/840,775, filed on Jun. 28, 2013.

(51) Int. Cl.
| | |
|---|---|
| H03M 1/00 | (2006.01) |
| G02F 7/00 | (2006.01) |
| G02F 1/225 | (2006.01) |
| G02F 1/015 | (2006.01) |
| H03M 1/12 | (2006.01) |

(52) U.S. Cl.
CPC ......... *G02F 7/00* (2013.01); *G02F 1/015* (2013.01); *G02F 1/2255* (2013.01); *G02F 1/2257* (2013.01); *H03M 1/1245* (2013.01); *G02F 2001/0152* (2013.01); *G02F 2203/10* (2013.01)

(58) Field of Classification Search
CPC ............................... H03M 1/1245; G02F 7/00
USPC .......... 341/137, 155, 122; 359/291, 237, 245; 73/105
See application file for complete search history.

(56) References Cited

U.S. PATENT DOCUMENTS

| | | | |
|---|---|---|---|
| 6,542,682 | B2 | 4/2003 | Cotteverte et al. |
| 7,116,864 | B2 | 10/2006 | Yanik et al. |

(Continued)

OTHER PUBLICATIONS

Xu, et al "Bio-Sensing by Mach-Zehnder Interferometer Comprising Doubly-Corrugated Spoofed Surface Plasmon Polariton (DC-SSPP) Waveguide", IEEE Transactions on Terahertz Science and Technology, vol. 2, No. 4 (Jun. 26, 2012).

(Continued)

*Primary Examiner* — Peguy Jean Pierre
(74) *Attorney, Agent, or Firm* — Harness, Dickey & Pierce, PLC

(57) ABSTRACT

A high-speed terahertz analog-to-digital converter (ADC) is provided. The ADC is comprised of an interferometer, a modulator and an array of detectors. The interferometer is configured to receive a carrier signal and guide a spoofed surface plasmon polariton (SSPP) wave in each of its two arms. The SSPP waves are emitted from the free end of each arm into a propagation space and combined in the space to form an interference wave. The modulator modulates the carrier signal in at least one of two arms with a modulating signal, where the radiation pattern of the interference wave in a far field of the propagation space is shifted in accordance with the amplitude of the modulating signal. The array of detectors are spatially separated from the interferometer by the propagation space and arranged to receive the interference wave.

29 Claims, 14 Drawing Sheets

(56) References Cited

U.S. PATENT DOCUMENTS

| | | | |
|---|---|---|---|
| 7,531,803 B2* | 5/2009 | Mittleman | G01J 3/42 250/341.1 |
| 7,663,107 B2 | 2/2010 | Taday | |
| 7,709,247 B2 | 5/2010 | Koo et al. | |
| 8,111,443 B1 | 2/2012 | Russell et al. | |
| 8,139,283 B2* | 3/2012 | Aksyuk | B82Y 20/00 359/291 |
| 8,699,013 B2* | 4/2014 | Ogawa | G01M 11/331 356/451 |
| 8,767,207 B2* | 7/2014 | Benisty | B82Y 15/00 356/219 |
| 8,793,811 B1* | 7/2014 | Prater | G01Q 20/02 73/105 |
| 2006/0109541 A1 | 5/2006 | Osipov et al. | |
| 2009/0262766 A1 | 10/2009 | Chen et al. | |
| 2012/0019901 A1 | 1/2012 | Mazumder | |

OTHER PUBLICATIONS

Xu, et al "Analysis of Doubly Corrugated Spoofed Surface Plasmon Polariton (DC-SSPP) Structure With Sub-Wavelength Transmission at THz Frequencies", IEEE Transactions on Terahertz Science and Technology, vol. 2, Issue 3, pp. 345-354, (May 2012).

A. Rahman et al's "Ultrasensitive Label-Free Detection and Quantitation of DNA Hybridization via Terahertz Spectrometry", Conference on Imaging Manipulation, and Analysis of Biomolecules, Cells and Tissues VIII, (Jan. 2010).

Song et al., "Active Tera Hertz (THx) Spoof Surface Plasmon Polariton (SSPP) Switch Comprising the Perfect Conductor Meta-Material", IEEE Nano, pp. 98-101, (2009).

Song, et al., "Smooth Surface Plasmon Polariton Switches for GHz-THz System", IEEE Nano, pp. 1420-1423, (2011).

* cited by examiner

TERAHERTZ ANALOG-TO-DIGITAL CONVERTER EMPLOYING ACTIVE-CONTROLLED SPOOFED SURFACE PLASMON POLARITON ARCHITECTURE

CROSS-REFERENCE TO RELATED APPLICATIONS

This application claims the benefit of U.S. Provisional Application No. 61/840,775, filed on Jun. 28, 2013. The entire disclosure of the above application is incorporated herein by reference.

GOVERNMENT INTEREST

This invention was made with government support under FA9550-12-1-0402 awarded by the United States Air Force/AFOSR. The Government has certain rights in the invention.

FIELD

The present disclosure relates to an analog-to-digital converter employing active-controlled spoofed surface plasmon polariton architecture.

BACKGROUND

Structures and devices designed to work in the frequency range of 0.1-10 THz are proved to be essential in imaging, spectroscopy, biosensing and other applications alike. They are also strong candidates for building the next-generation integrated circuits that will eventually close the gap between electronics and optics. Concentration of terahertz radiation in small volumes can facilitate the sub-wavelength transmission of the signal, generating new possibilities for low-loss, low-dispersion delivery of terahertz radiation over distance. The strong confinement of the E-M field can also enhance the signal-matter interaction, hence maximizing the modulation efficiency in active device designs.

Strong mode localization at terahertz frequency is realized by adding periodic surface features onto the material interface of conventional waveguide structures. Unlike using resonant structures with dimensions comparable with the wavelength, the metamaterial created by the sub-wavelength surface modifications can support a special surface mode, named spoofed surface plasmon polariton (SSPP) mode. With discrete transmission peaks and valleys, the SSPP modes can be modulated by changing geometric dimensions and material parameters of the structure. In most of the studies employing SSPP terahertz architectures, the discrete passing bands and their amplitude modulation due to external stimuli serve at the backbone of the device functionality.

Kramers-Kronig relationship dictates coupled evolution of the real and imaginary parts of the dielectric constant. Therefore, the change in transmittance must be accompanied with the shift in phase accumulation. The inclusion of phase information is, hence, critical in the effort to achieve higher resolution and sensitivity for the SSPP terahertz devices. A metamaterial terahertz phase modulator based on metallic split-ring resonator design has been proposed. In the proposed design, voltage across the Schottky contact formed by the doped semiconductor (GaAs) layer and metal electrode causes depletion of free carriers, changing the complex transmittance of the structure at terahertz frequencies. Phase modulators in the form of waveguides have also been proposed and fabricated by a number of research groups, where doped Si is used to form a thin strip ring resonator. The phase of the propagating signal can be adjusted by free carrier injection through a p-i-n junction, and as a result, the coupling efficiency of the ring resonator can be modulated. Due to the large loss tangent of Si in terahertz domain however, such design can only be effectively applied up to near-infrared frequencies.

In this disclosure, a terahertz beam bender is presented that can be actively controlled through free carrier density modulations. Based on this phenomenon, a multibit analog-to-digital converter (ADC) can be realized that utilizes terahertz signals. The disclosure is organized as follows. First, the mathematical analysis of the DC-SSPP structure will be briefly described and phase modulation with refractive index change in a simplified model will be presented. Next, finite-element simulations for the terahertz beam bender operating in the enhancement mode and depletion mode will be discussed, followed by a section on design and analysis of the ADC.

This section provides background information related to the present disclosure which is not necessarily prior art.

SUMMARY

This section provides a general summary of the disclosure, and is not a comprehensive disclosure of its full scope or all of its features.

An analog-to-digital converter is presented. The analog-to-digital converter includes: an interferometer, a modulator interfaced with the interferometer, and an array of detectors spatially separated from the interferometer by the propagation space and arranged to receive an interference wave from the interferometer. The interferometer has an input configured to receive a carrier signal and two arms. Each arm is configured to guide a spoofed surface plasmon polariton wave from one end of the arm to the free end of the arm, such that the spoofed surface plasmon polariton waves propagate at a speed slower than the carrier signal and are emitted from the free end of each arm into a propagation space and combine in the propagation space to form an interference wave. The modulator modulates the carrier signal in at least one of the two arms with a modulating signal, where the modulating signal has an amplitude in a predefined range of values and the radiation pattern of the interference wave in a far field of the propagation space is shifted in accordance with the amplitude of the modulating signal.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

Corresponding reference numerals indicate corresponding parts throughout the several views of the drawings.

DETAILED DESCRIPTION

Example embodiments will now be described more fully with reference to the accompanying drawings.

Figure 1:
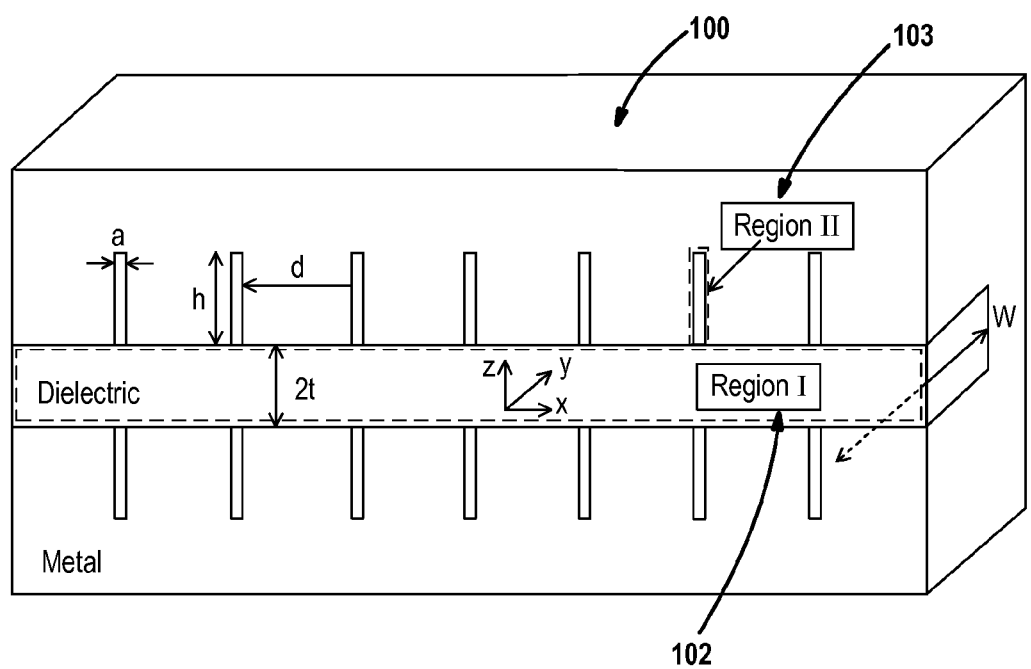
FIG. 1 is cross-section view of a doubly corrugated spoofed surface plasmon polariton (DC-SSPP) structure with different geometric dimensions labeled.

FIG. 1 depicts a doubly corrugated spoofed surface plasmon polariton (DC-SSPP) structure 100. In order to derive the mathematical form of the dispersion relation, the whole structure is divided into two separate regions 102,103. Vector E-M fields are expressed in both regions and are connected using boundary conditions. Following a strict mathematical deduction, the mode dispersion relationship is obtained as follows:

$$1 + \Sigma_{n=-\infty}^{\infty} \frac{k_{z,II}}{k_{z,I}^{(n)}} \frac{|T_n|^2}{\tan(k_{z,I}^{(n)})} \tan(k_{z,II}h) = 0 \quad (1)$$

for symmetric mode, and $$1 + \Sigma_{n=-\infty}^{\infty} \frac{k_{z,II}}{k_{z,I}^{(n)}} |T_n|^2 \tan(k_{z,I}^{(n)}t) \tan(k_{z,II}h) = 0 \quad (2)$$

for antisymmetric mode, where $$|T_n|^2 = \left| \sqrt{\frac{1}{ad}} \int_0^a e^{jk_{x,I}^{(n)}x} dx \right|^2 = \frac{a}{d} \left| \mathrm{sinc}\left( \frac{k_{x,I}^{(n)}}{2} a \right) \right|^2. \quad (3)$$

In the above descriptions, the symmetry of the mode is determined by the y-component of the magnetic field. Physical parameters, namely, a, d, h, t, are different geometrical dimensions of the structure as shown in FIG. 1. More specifically, a is the width of a groove, d is the periodic interval or distance between the grooves, h is height of a groove, 2t is the thickness of the waveguide along the z-axis and W is the dimension of the waveguide along the y-axis. $k_{x,I}^{(n)}$ and $k_{z,I}^{(n)}$ denote the wavevectors of the nth-order Floquet mode along x- and z-axes in Region I, and correspondingly, $k_{x,II}$ and $k_{z,II}$ denote the wavevectors along the two axes in Region II. For a complete description of variables in the above equations and a comprehensive deduction of the dispersion relation, refer to the article by Z. Xu et al's entitled "Analysis of doubly corrugated spoof surface plasmon polariton (DC-SSPP) structure with sub-wavelength transmission at THz frequencies," IEEE Trans. Terahertz Sci. Technol., Vol. 2, No. 3. pp. 345-354, May 2012, which is incorporated by reference in its entirety herein.

Figure 2A:
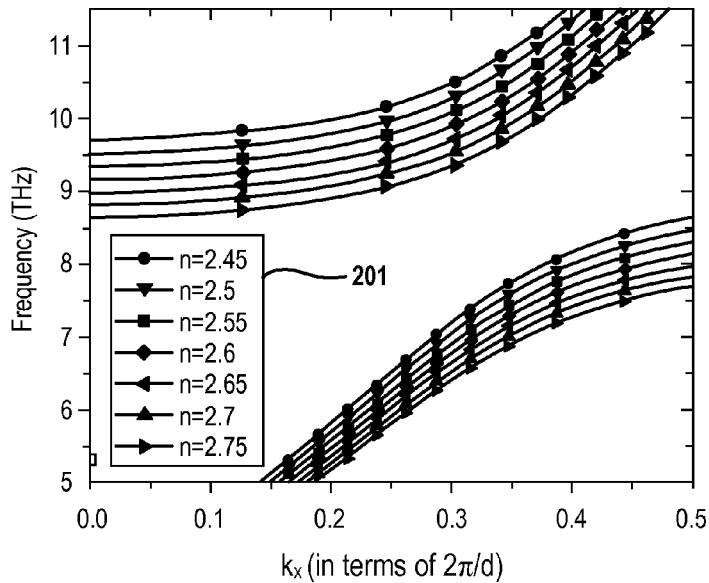
FIG. 2A is a graph depicting dispersion relations of the DC-SSPP waveguide with changing refractive index.
Figure 2B:
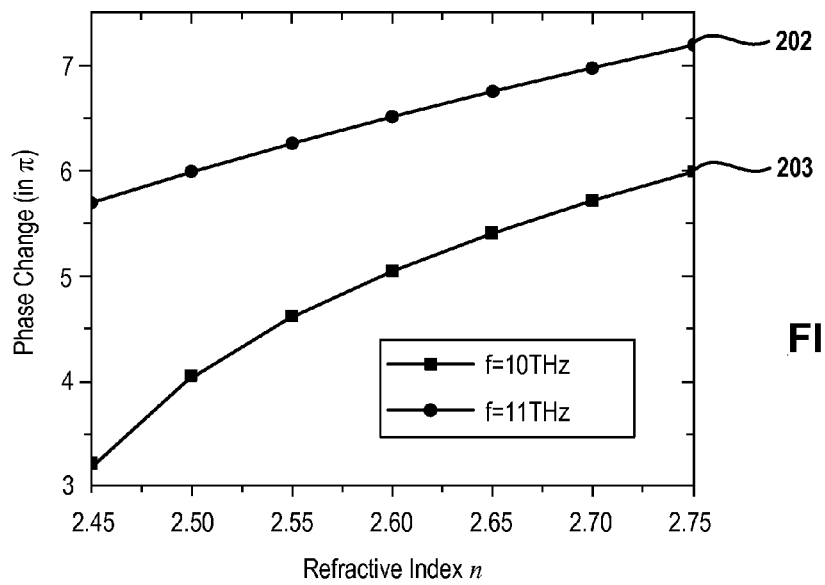
FIG. 2B is a graph depicting phase change of the terahertz wave after propagating through seven grooves of the DC-SSPP structure.

The wavevectors as solved by (1) and (2) are functions of the refractive index n. As a result, when n is modulated by certain external stimuli, the wavevector will be altered correspondingly. FIGS. 2A and 2B show the dispersion relation of an example DC-SSPP waveguide with dimensions $$d = 5.1 \text{ } \mu\text{m}, \frac{a}{d} = 0.1, \frac{h}{d} = 0.7, \frac{t}{d} = 0.3,$$

and W/d=3, as numerically calculated using MATLAB. The refractive index is set to change from 2.45 to 2.75 as indicated at 201 and is applied to the entire dielectric part of the waveguide. While the homogeneous change of the refractive index across the structure is a simplified assumption, this theoretical formulation is intrinsically fast to calculate. In this disclosure, it serves as the initial step in the design process before any numerical simulations are carried out.

In FIG. 2B, a significant shift of the overall phase accumulation can be observed for the two frequencies chosen 202, 203, which, when applied to a MZI structure, will give rise to changing interferometric output. In the design of terahertz beam bender, this MZI architecture is applied to achieve deflected beam radiation in the far field. To realize active external control, doped semiconductor is chosen as the dielectric material, and modulation to the refractive index is induced by injecting or depleting the free carriers within the semiconductor layer. While specific reference is made throughout this disclosure to terahertz signals, it is understood that the concepts described herein are applicable to signals having different frequencies, for example ranging from 100 GHz to 30 THz.

The working modes based on injection and depletion of free carriers in doped semiconductor are known as the enhancement mode and the depletion mode, respectively. This terminology is used to refer to two different types of terahertz beam bender designs in the following sections. As the mathematical model can only predict phase modulation of simple architectures with accuracy, finite-element simulations are performed on the realistic beam bender structures in order to verify the idea and optimize the design.

The dielectric constant of semiconductor as a function of frequency follows the Drude model. As a result of optical phonon vibrations of the crystal lattice in heteropolar semiconductors, the Drude model needs to be modified for these materials in terahertz frequencies and is expressed as $$\varepsilon(\omega) = \varepsilon_\infty + \frac{\omega_{TO}^2(\varepsilon_s - \varepsilon_\infty)}{\omega_{TO}^2 - \omega^2 - i\omega\gamma} - \frac{\omega_P^2}{\omega(\omega + i\Gamma)} \quad (4)$$

where $$\omega_P = \sqrt{\frac{Ne^2}{\varepsilon_0 m^*}}. \quad (5)$$

The variables in (4) and (5) are summarized in Table I below. The second term in (4) represents the contribution of optical phonons, whereas the third term counts for the effect of plasmonic oscillation and coherent decay of carrier electrons. Through $\omega_P$ relationship in (5), the dielectric constant is dependent on the free carrier density N of the semiconductor.

TABLE I

LIST OF VARIABLES IN THE DIELECTRIC CONSTANT MODEL FOR HETEROPOLAR SEMICONDUCTORS (MODIFIED DRUDE MODEL)

| | |
|---|---|
| $\varepsilon_\infty$ | High frequency dielectric constant |
| $\varepsilon_s$ | Static dielectric constant |
| $\varepsilon_0$ | Dielectric constant of vacuum |
| $\omega_p$ | Plasmonic resonance frequency |
| $\omega_{TO}$ | Transverse optical phonon resonance |
| $\omega$ | Frequency |
| $\Gamma$ | Coherent decay factor of free carriers |
| $\gamma$ | Phonon damping constant |
| N | Free carrier concentration |
| e | Charge of electron |
| $m^*$ | Effective mass of electron |

Figure 3A:
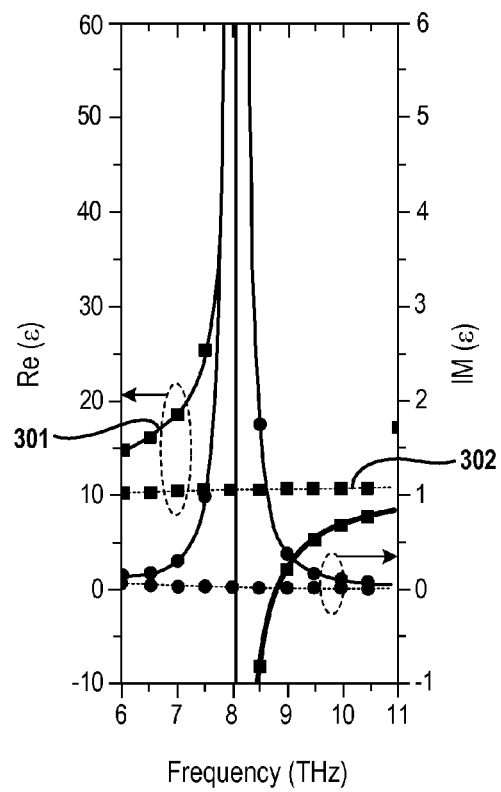
FIGS. 3A and 3B are graphs depicting the complex dielectric constant of GaAs as a function of frequency at N=2×10$^{16}$ cm$^{-3}$ and as a function of free carrier density at frequency of 10 terahertz, respectively.
Figure 3B:
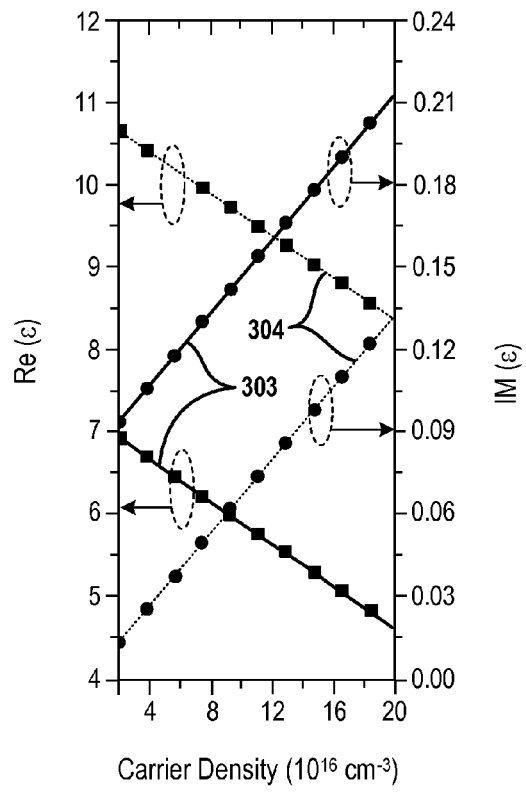

As an example, the dielectric constant of GaAs is calculated as a function of frequency and free carrier density using (4), and the result is illustrated in FIGS. 3A and 3B. With the free carrier concentration of $N=2\times10^{16}$ cm$^{-3}$, the phonon resonance can be clearly marked by the sharp peak at 301 in the curve of imaginary $\in$ versus frequency (and abrupt change in the curve of real $\in$) to be 8.05 THz. To illustrate the significance of the phonon resonance, the dielectric constant calculated without the second term in (4) is also included in FIG. 3 (thin dashed line at 304) with visibly large discrepancies.

Among the common semiconductor materials, GaAs has low intrinsic free carrier density, moderate carrier mobility, and electron effective mass. As observed from FIG. 3B, in terahertz frequencies, GaAs demonstrates effective change of the real $\in$ with different free carrier densities, as indicated at 303 and mild change to the small imaginary $\in$ at the same time as indicated at 304. Such properties are desirable in this application, where large modulation depth and stable power output throughout the working range are required. As a result, GaAs is deployed as the semiconductor material in the design of the terahertz beam bender. While particular reference is made to GaAs, it is readily understood that other types of semiconductor materials having low intrinsic free carrier density, moderate carrier mobility and electron effective mass, such as InSb, also fall within the scope of this disclosure.

Figure 4:
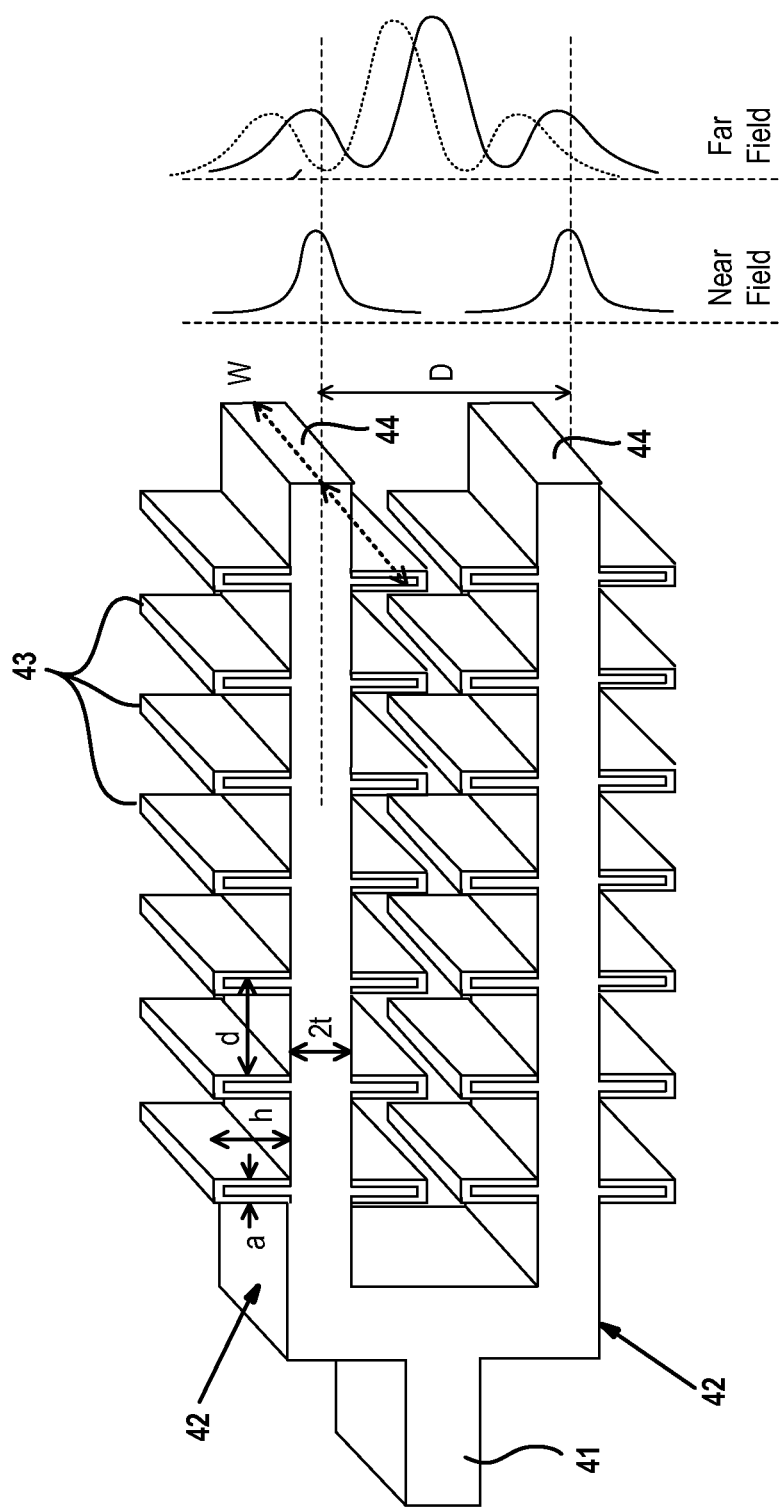
FIG. 4 is a cross section view of an example beam steering structure with different geometric dimensions labeled.

FIG. 4 illustrates the structure for an example beam bender (also referred to herein as an interferometer). The beam bender 40 is comprised generally of an input 41, two arms 42 and two output ports 44. The two arms 42 are coupled together at one end to define the input 41; whereas, the output ports are disposed at the free end of the arms 42. That is, the two arms 42 are combined in the form of a Mach-Zehnder interferometer with separate output ports 44. A plurality of protrusions 43 protrude from each of the arms 42 (the protrusions are also referred to herein as grooves). In the example embodiment, there are seven protrusions spaced at periodic intervals although more or less protrusions may be used. For each arm, there is a first subset of protrusions extending inward towards the other arm and a second subset of protrusions extending in the opposite direction away from the other arm. An electromagnetic (EM) wave (ie., carrier signal) received at the input 41 is guided by both arms 42 to the two output ports 44 as will be further described below. Other arrangements for the beam bender may also fall with the broader aspects of this disclosure.

In the example embodiment, the entire beam bender structure 40 is made of an intrinsic semiconductor (e.g., GaAs) covered by metal, with an exception in the grooves 43, where dopants are introduced to create a thin layer of n-type GaAs. In some embodiments, dopants may be introduced throughout the entire region of grooves or some select portions thereof depending on the application. In other embodiments, the intrinsic semiconductor material is encased in a metal structure of varying dimensions (e.g., thickness). Although not a focus of this particular report, this structure can be fabricated following conventional procedures, including electron beam lithography for patterning, dopant implantation for defining the n-GaAs region, and physical vapor deposition for forming the metal shell.

For the beam bender, spoofed surface plasmon polariton (SSPP) waves are derived from the input carrier signal and traverse through the arms 42 of the waveguide along the metal-dielectric interface, where the SSPP waves propagate at a speed slower than the input carrier wave. In particular, the SSPP mode is largely confined to the groove region near resonance. The localized n-GaAs can, therefore, effectively lower the insertion loss of the device without sacrificing the performance.

Free carriers are injected into the semiconductor material of one or both arms 42 via an external stimulus. Such stimuli can be thermal, optical, or electrical depending on its specific applications. For example, thermal carrier injection can be achieved via direct thermal contact of the heated metal. In another example, free carriers are injected electrically using a metal electrode formed on an exterior surface of the beam bender. A forward bias voltage is applied to the junction formed by the metal and the semiconductor. The applied voltage serves as a modulating signal having an amplitude selected from a predefined range of values. In either case, free carriers are injected into the semiconductor which in turn changes the effective refractive index of the material. Consequently, the radiation pattern (i.e., angle of radiation) of wave in the far field is shifted in accordance with the amplitude of the modulating signal.

HFSS is used to simulate the beam bender structure as mentioned previously, with the dimensions of each SSPP arm being $$d = 4.9 \ \mu m, \frac{a}{d} = 0.1, \frac{h}{d} = 0.7, \frac{t}{d} = 0.3, \frac{W}{d} = 3,$$

and the separation between the arms being $$\frac{D}{d} = 2.5.$$

Figure 5A:
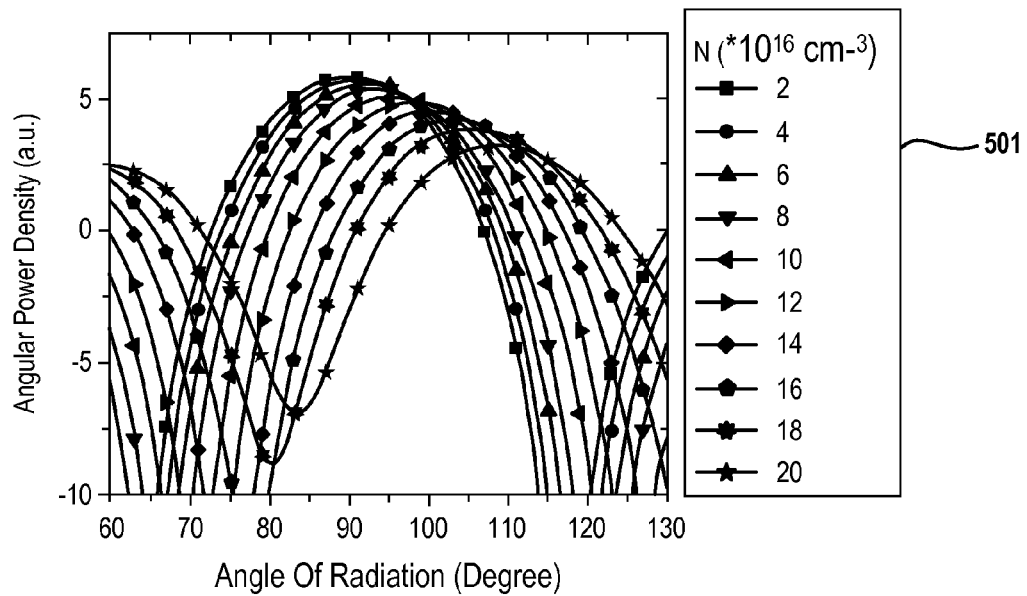
FIG. 5A is a graph depicting angular power density of the beam bender output at a frequency of 10 terahertz with different free carrier concentrations.
Figure 5B:
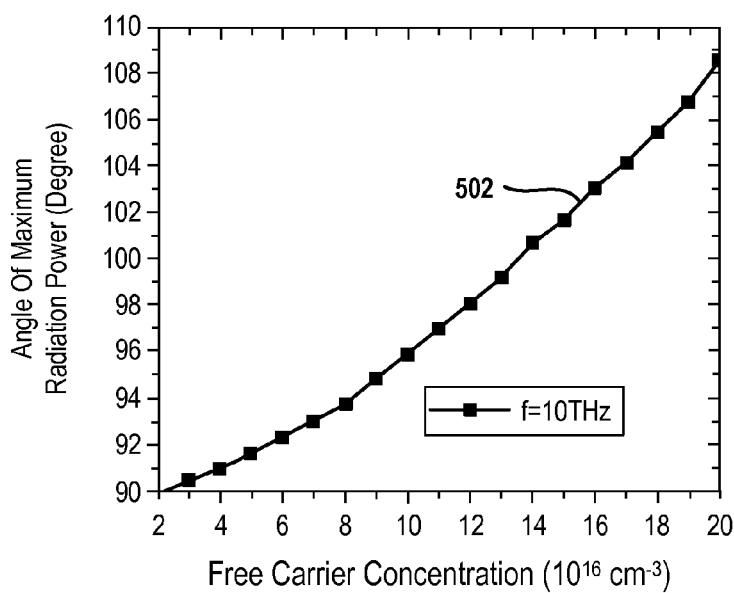
FIG. 5B is a graph depicting angle of maximum radiation power as a function of free carrier density.

The angular output radiation from the beam bender structure modulated by the free carrier concentration is illustrated in FIGS. 5A and 5B. The GaAs in this case has an initial doping concentration of $N=2\times 10^{16}$ cm$^{-3}$. At the operating frequency of 10 THz, such carrier density corresponds to the dielectric constant of $\in=6.91+i0.09$ (n=2.63+i0.02). In the simulation, the free carrier concentration of the n-GaAs layer of thickness $\delta=100$ nm is changed in one arm from $N=2\times 10^{16}$ cm$^{-3}$ to $N=2\times 10^{17}$ cm$^{-3}$ at 501 as a result of carrier injection. FIG. 5A shows the change of the angular radiation power density. It follows that the angle of maximum radiation power is a function of the carrier density as plotted at 502 in FIG. 5B. A change up to 18° in the angle of radiation is observed in the interference wave output from the beam bender structure. Accordingly, it has been shown that the radiation pattern of the interference wave in a far field of the propagation space is shifted in accordance with the amplitude of the modulating signal.

The slight nonlinearity of the curve in FIG. 5B comes from the modified Drude model. From equations (4) and (5), and FIG. 3, it is easy to notice the linear evolution of $\in$ with N. The phase change, on the other hand, is proportional to $n=\sqrt{\in}\propto\sqrt{N}$. A simple mathematic routine of Taylor expansion, however, shows that such nonlinearity can be mostly corrected when carriers are injected in both arms in a differential manner. That is, the carrier density in one arm is increased while that in the other arm is decreased, keeping the overall carrier concentration a constant. This may be accomplished, for example by applying modulating signals to both arms of the interferometer such that the modulating signals are 180 degrees out of phase with each other. The insertion loss, on the other hand, is obtained as the portion of output power versus input to be 4 dB. About 2 dB of this loss is found to come from reflection of the bifurcated MZI structure and the Fabry-Perot (F-P) echelon effect, which can be further alleviated by optimizing the design therein.

Figure 6A:
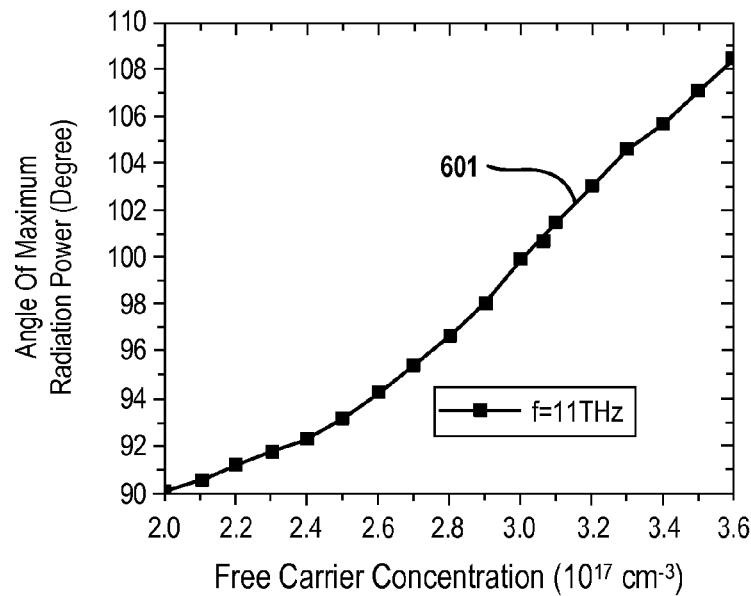
FIGS. 6A and 6B are graphs depicting angle of maximum radiation power as a function of free carrier concentration for operation at a frequency of 11 terahertz and 24 terahertz, respectively.
Figure 6B:
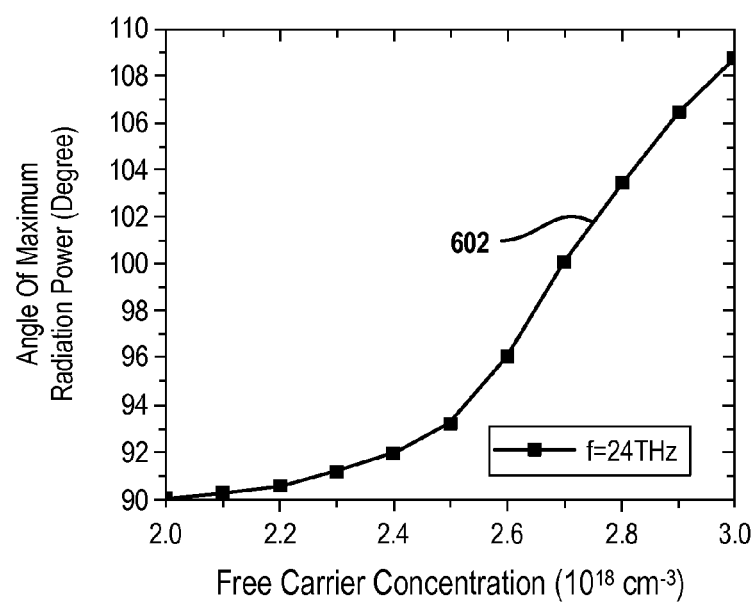

In addition to the given example, the beam bending effect is not confined by specific structural dimensions. In fact, the initial doping concentration of n-GaAs and operating frequency of the structure can change in pairs, as long as the imaginary refractive index is not too large to prevent effective wave propagation. Correspondingly, the dimensions of the structure can be adjusted in scale, making this design highly adaptable to various requirements. As an example, using (4), the operating frequencies of initial doping density of $N=2\times 10^{17}$ cm$^{-3}$ and $N=2\times 10^{18}$ cm$^{-3}$ are calculated to be 11 and 24 THz, corresponding to the refractive indices of n=2.54+i0.03 and n=2.49+i0.02, respectively. For these operating frequencies, the beam bender has the size of d=4.2 μm and d=1.9 μm individually. The output angle as a function of free carrier density in those two cases (601 and 602) is illustrated in FIGS. 6A and 6B. Similarly, the beam bending is accompanied with nonlinearity, which can be effectively overcome when differential carrier injection is applied. The refractive indices in these two cases are chosen such that the insertion losses are comparable, and of which a significant contribution still comes from the MZI structure itself.

Since the doping concentration of GaAs layer is much higher than its intrinsic free carrier density ($N_i=2.1\times 10^6$ cm$^{-3}$), the beam bender 40 can also operate in depletion mode. In this mode, a Schottky contact is formed by the metal electrode and the underlying semiconductor material. By applying a negative biased voltage across the Schottky contact, the free carriers will be extracted and a depletion zone will be formed. The thickness of the depletion zone as a function of the external voltage is given by $$D_{dep} = \sqrt{\frac{2\varepsilon_s\varepsilon_0(V_{bi} + V)}{eN}}. \quad (6)$$

Figure 7A:
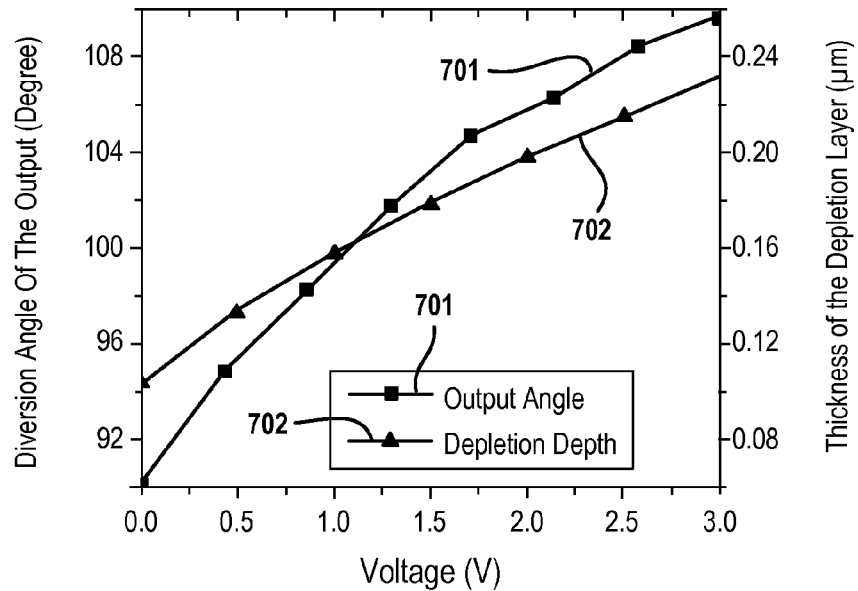
FIG. 7A is a graph depicting thickness of the depletion layer in n-GaAs and deflection angle of the beam output as a function of voltage with initial doping concentration of 1×10$^{17}$ cm$^{-3}$.

Descriptions of the variables in (6) are included in Table I. $V_{bi}=0.75$ V is the built-in voltage for the metal-GaAs junction, and V is the applied voltage. The relationship of (6) is plotted at 701 in FIG. 7A for the doping concentration $N=1\times 10^{17}$ cm$^{-3}$ in GaAs and V from 0 to 3 V, where the applied voltage serves as a modulating signal. The effective change in the refractive index of the semiconductor material changes in accordance with amplitude of the modulating signal which in turn shifts the radiation pattern of the wave in the far field.

In depletion mode, a similar MZI structure is used as in enhancement mode, with the only exception of the n-type GaAs, which in this case occupies the entire groove region. In the depletion mode, when the n-GaAs in one arm is depleted by various thicknesses via external voltage, the phase of the propagating terahertz signal is changed and the output radiation is deflected accordingly. Such deflection effect is also illustrated at 702 in FIG. 7A for the structure with dimensions $$d = 4.75 \ \mu m, \frac{a}{d} = 0.1, \frac{h}{d} = 0.7, \frac{t}{d} = 0.3, \frac{W}{d} = 3, \frac{D}{d} = 2.5,$$

and the initial free carrier concentration of $N=1\times 10^{17}$ cm$^{-3}$. The operating frequency of the structure in this case is 10 THz, and a maximum deflection angle of 19° is achieved with the voltage of 3 V. The insertion loss in this case is obtained as 7.7 dB in the worst case scenario (V=0 V with minimum depletion), of which ~4 dB results from the reflection off the bifurcated MZI structure and the F-P echelon effect. The higher loss compared with the enhancement mode also partially comes from the doped GaAs layers, which are effectively 2.5 times thicker in this case.

Figure 7B:
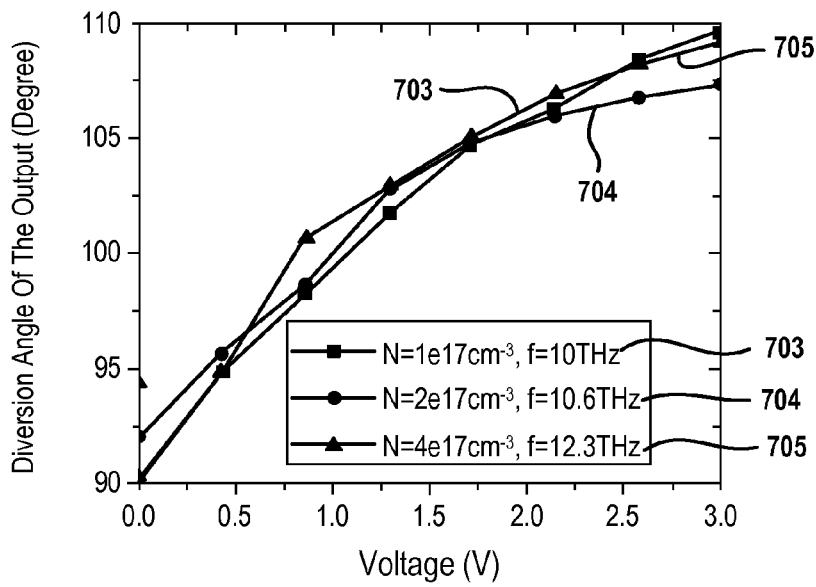
FIG. 7B is a graph depicting deflection angle of the beam output as a function of voltage for various doping concentrations.

Similar to the enhancement mode, the beam bender 40 in the depletion mode can operate with different combinations of frequency and doping concentrations. In FIG. 7B, the output angle as a function of the control voltage for different initial doping concentrations up to $N=4\times 10^{17}$ cm$^{-3}$ are shown and compared by 703, 704 and 705. The dimension of the structure is adjusted to d=4.4 μm and d=3.7 μm for the cases of $N=2\times 10^{17}$ cm$^{-3}$ and $N=4\times 10^{17}$ cm$^{-3}$, respectively, and the operating frequencies are chosen such that effective beam deflection and comparable insertion loss are obtained. In all circumstances, the nonlinear increase of the deflection angle is caused by the proportionality between $D_{dep}$ and $\sqrt{V_{bi}+V}$. Again, such nonlinearity can be mostly corrected when differential voltage is applied to both arms of the MZI structure.

Earlier, the beam bending effect of the DC-SSPP architecture was demonstrated. The ability to control the deflection angle of the output through external stimuli makes such a structure valuable in building a number of active devices. A spatial-resolved terahertz ADC is one of the many important applications.

Analog-to-digital conversion is an indispensable technology for mixed-signal circuits. Although electronic ADCs have been primarily used for the task, alternatives such as optically assisted and all-optical ADCs have been intensely studied to overcome the performance limitations of the electronic ADCs. Among them, the idea of an optical ADC operating on diverted far-field radiation patterns has been proposed by H. F. Taylor in the "An optical analog-to-digital converter—Design and analysis", IEEE J. Quantum Electron, Vol. 15, No. 4, pp. 210-216, April, 1979, where multiple phase shifters with geometrically increasing lengths were used. In recent years, further works have been conducted in an effort to realize high-speed analog-to-digital conversion. For example, others have used the quantum-confined Stark effect to induce the phase change in one or both arms of an MZI waveguide consisting of travelling-wave shifters. The diverted beam is received by detector arrays arranged in binary manner and digitized output is readout directly.

Despite its wide bandwidth (BW) in theory, the speed advantage of optical ADC has yet been fully utilized due to the lack of resonant conversion between photons and electrons. Terahertz frequency band, on the other hand, can interact coherently with electronics, and is hence a more promising candidate for building high-speed integrated components. A terahertz ADC design can serve as a gateway to emerging landscapes of broadband, terahertz-assisted, as well as all-terahertz systems.

In the terahertz domain, the index-guiding waveguide design shows small modal confinement factor and high signal power loss, hence is incapable of delivering signals at these frequencies with good beam quality and radiation efficiency. To overcome this problem, the DC-SSPP structure is applied to realize confined propagation of terahertz wave in the form of a spoofed surface mode. Room-temperature, spatial-resolved ADC operations employing terahertz carrier signals can be realized by having the DC-SSPP beam bender 40 as the first stage 802, as is shown in the architecture shown in FIG. 8.

In the proposed ADC design, depletion mode is chosen as the operating mode to enable beam steering, and the control voltage 801 serves as the analog input. The change in the position of radiation maxima can be interpreted into binary bits by the detector arrays when their positions and properties are carefully designed.

In the example embodiment, the beam deflector stage of the terahertz ADC consists of 10 periods of grooves on each arm of the interferometer structure and has dimensions of $$d = 4.75 \text{ μm}, \frac{a}{d} = 0.1, \frac{h}{d} = 0.7, \frac{t}{d} = 0.3, \frac{W}{d} = 3, \text{ and } \frac{D}{d} = 2.5.$$

Figure 9A:
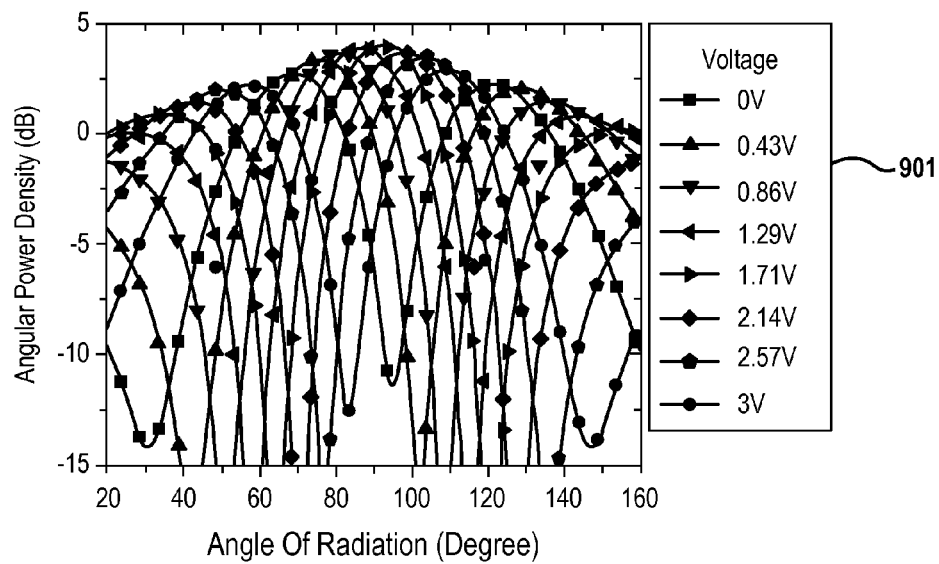
FIG. 9A is a graph depicting angular radiation power density.
Figure 9B:
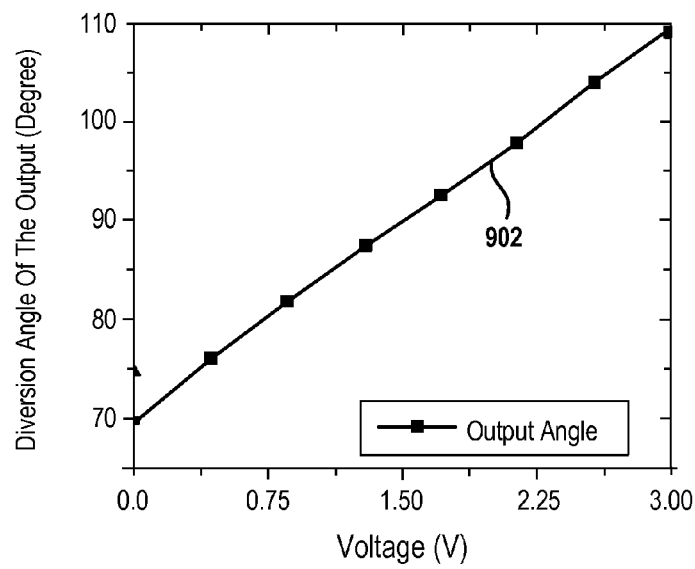
FIG. 9B is a graph depicting deflection angle of the beam output as a function of voltage.

The initial doping concentration of the n-GaAs in the groove region is $N=1\times10^{17}$ cm$^{-3}$. When compared with the structure described above, a fully differential implementation is adopted here, where voltages are simultaneously applied to both arms of the MZI. This has resulted in a significant increase in the maximum deflection angle of the output. As shown in FIG. 9, with a voltage change of 0-3 V as indicated at 901, the deflection angle of the terahertz output can change in a wide range of ±20°. The symmetric shift of the beam peak position over normal radiation (90°) is important in ADC operations since the detector arrays are arranged in a mirror symmetric manner. From FIG. 9B, this symmetry along with the perfect linearity of the output angle as a function of input voltage is observed at 902 with the application of differential voltages to both arms. The insertion loss in this case is obtained as 7.9 dB. Similarly, it is expected to be significantly lowered with an improved design of the interferometer structure.

Figure 10A:
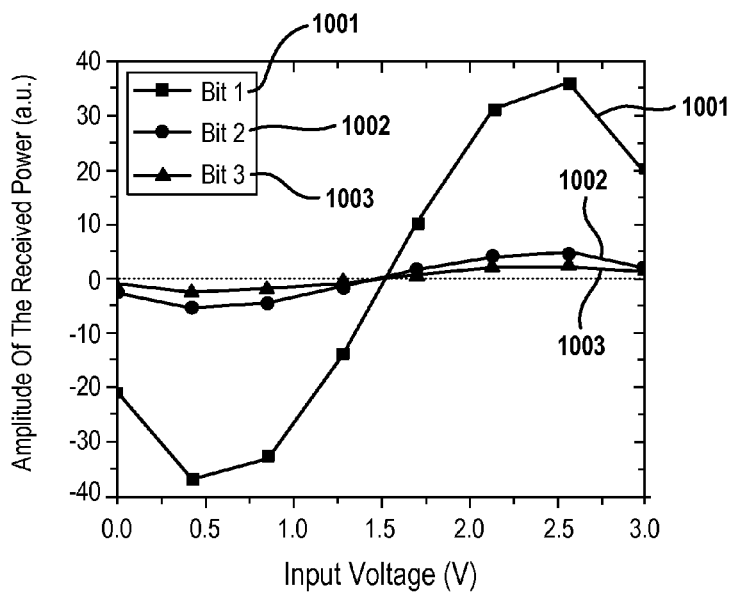
FIGS. 10A and 10B are graphs depicting a 3-bit readout from the ADC from linear detector arrays and nonlinear detector arrays, respectively.

In ideal cases of the ADC design employing beam steering mechanisms, the main peak of the radiation pattern needs to be coupled independently into separate detectors in order to directly readout the digitized bits of the analog input. By applying classic diffraction theories, it is easy to conclude that in this case, at least $N_s = 2^n$ phase shifters in the first stage are needed in order to realize an n-bit ADC. In this design, however, only two SSPP branches are used to form the MZI structure. Therefore, for any attempt to have more than 1-bit digitized output, the radiation peak can only be partially coupled into separate detectors. The outcome as a result of the partial coupling is shown in FIG. 10A, where eight identical linear detectors are used in an attempt to obtain a 3-bit output. It is observed that only one period of the sign change can be obtained at 1001 for all 3 bits in this case, which indicates an actual ADC resolution of only 1 bit.

Figure 8:
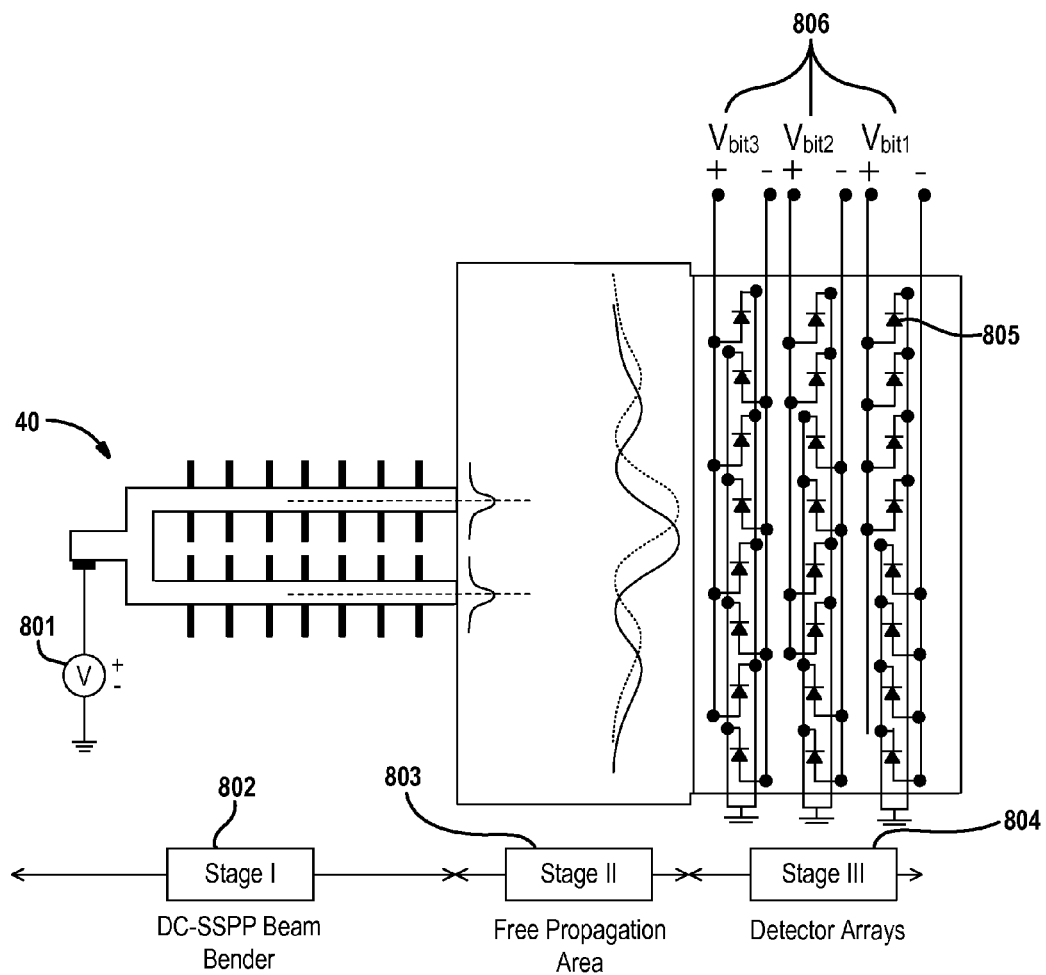
FIG. 8 is a diagram of an analog-to-digital converter based on the DC-SSPP beam bender.
Figure 10B:
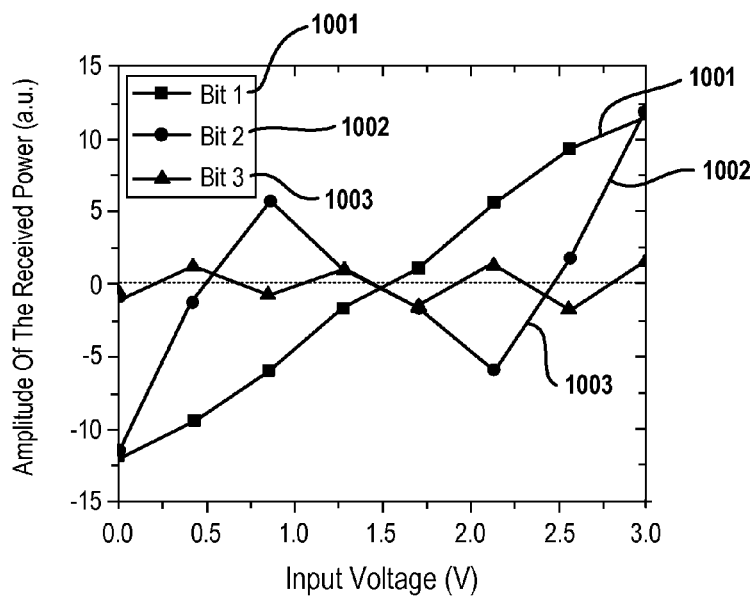

To tackle this problem, detectors operating in saturated conditions are employed. With carefully designed gains and nonlinearities for the detector arrays, up to $2^n$ periods of sign change within $2\pi$ phase shift for the nth bit output can be achieved. In Table II, an example of such a design for an array of eight detectors (#1-#8 from the top to the bottom as shown in FIG. 8) is summarized. The non-unity relative gain is used to emphasize the edges of the main radiation peak. The saturation power is determined in a way that a considerable width centered on the peak position is deemed as equal by the detectors, and its value is given in the arbitrary unit so that it can be in reality proportionally adjusted to fit different terahertz source and detector specifications. FIG. 10B shows the digitized readout 1001, 1002 and 1003 from such detector array. A 3-bit output can be obtained in this case with the analog input voltage changing from 0 to 3 V. It should be noted that in the actual realization of the ADC, the detector arrays will have finite width along the transverse dimension (y-axis) of the output beam. Due to the nonuniform power distribution along this direction, the gains and nonlinearities of the detector stages need to be adjusted accordingly.

TABLE II

DESIGN OF DETECTOR ARRAYS IN A 3-BIT ADC IN TERMS OF GAIN AND SATURATION POWER

| Detector # | Gain (relative) | Saturation power (a.u.) |
|---|---|---|
| 1, 8 | 2× | 3 |
| 2, 7 | 2× | 5 |
| 3, 6 | 2× | 7 |
| 4, 5 | 3× | 9 |

The effort to increase the operating bandwidth of electrical sampling ADC is challenged by the relatively large temporal jitter of the sampling signal. Recent developments in optical ADC have attempted to solve this problem using ultra stable sampling pulses of mode-locked lasers, whereas the speed of operation of such design is still limited by the bandwidth of the E-O modulator stage. Despite the small jitter of the pulses, the repetition rate of the state-of-the-art mode-locked laser is mostly in the sub-gigahertz range. As a result, to date, the bandwidth characterization of optical sampling ADCs is carried out by either using sinusoidal continuous wave analog input, or by generating significantly aliased signals after digitization with under-sampling.

In the proposed terahertz ADC design, it is helpful to calculate the operating bandwidth of the beam deflector stage (analogy to the E-O modulator stage in optical ADC), which will provide a good idea of the speed performance of the design in comparison with its optical counterparts. In depletion mode, the Schottky contact formed by the electrode and doped GaAs layer contributes to a finite phase settling time of the modulator, which in turn will determine the operating bandwidth of the stage as described by the following formula:

$$BW \leq \frac{1}{21n2(b+1)T_{set}} \quad (7)$$

In the above equations, $T_{set}$ stands for the phase settling time, and b is the bit depth of the ADC (b=3, in our case). $T_{set}$ is determined by the carrier transit time and the parasitic RC time constant of the Schottky contact, which will be calculated separately in the following paragraphs.

When the space-charge region is reasonably thin, and the electric field is not very strong, the carrier transit time of a Schottky contact can be calculated mathematically. When the two terminals are separated by a distance comparable with the mean free path of the carrier motion, the electrons undergo ballistic transport, which is best described as the accelerated motion under the external bias voltage. The dc-transit time in this case can be obtained as $$\tau_{trans} = \frac{\pi}{2}\sqrt{\frac{m*\varepsilon_s\varepsilon_0}{Ne^2}} = \frac{\pi\sqrt{\varepsilon_s}}{2\omega_P} \quad (8)$$

In this case, with $N=1\times10^{17}$ cm$^{-3}$, $\tau_{trans}$ is calculated by (8) to be 0.08 ps. It corresponds to an average carrier drift velocity in the order of $10^6$ m/s, which far exceeds the saturation drift velocity $v_{sat}=8\times10^4$ m/s for GaAs at this electric field intensity. This indicates that the electron motion in this case cannot be simplified as ideal ballistic transport. Instead, collision plays an important role in the carrier motion and can significantly slow it down.

The realistic $\tau_{trans}$ is, therefore, estimated with the following equation, with d being the carrier displacement:

$$\tau_{trans} = \frac{d}{v_{sat}} \quad (9)$$

In the worst case, where d=0.13 μm for a voltage change of 3 V, the time constant is calculated to be 1.63 ps. Although it is significantly larger than the ideal case, the small, picosecond scale of this term still shows the intrinsic advantage of devices working in the depletion mode, as the operation speed is not limited by the slow diffusion of minority carriers.

The RC time constant, on the other hand, is determined by the series resistance and the barrier capacitance of the Schottky contact. These characteristic impedance values are dependent on the geometric dimension of the contact and are further influenced by nonideality factors such as skin effect, carrier inertia, and displacement current. In a realistic situation, one can define the dielectric relaxation frequency $\omega_d$ and the scattering frequency $\omega_s$ to count for the effect of the above-mentioned nonidealities $$\omega_d = \frac{\sigma}{\varepsilon_s\varepsilon_0} \quad (10)$$

$$\omega_s = \frac{e}{m*\mu}. \quad (11)$$

In (10) and (11), σ is the conductivity, and μ represents the carrier mobility of the semiconductor. Assuming the Schottky contact and the semiconductor substrate are of circular shape of radii r and r', respectively, the bulk spread impedance and skin effect impedance are then defined as ($\mu_0$ being the permeability of vacuum)

$$Z_s = \frac{1}{4\sigma r}\left[\frac{1}{1+j\omega/\omega_s} + j\omega/\omega_d\right]^{-1} \quad (12)$$

$$Z' = \frac{\ln(r'/r)}{2\pi}\sqrt{\frac{j\omega\mu_0}{\sigma}}\left[\sqrt{\frac{1}{1+j\omega/\omega_s}} + j\omega/\omega_d\right]^{-1}. \quad (13)$$

The barrier capacitance is calculated by $$C = \frac{\pi r^2 \varepsilon_s \varepsilon_0}{D_{dep}} = \pi r^2 \sqrt{\frac{eN\varepsilon_s\varepsilon_0}{2(V_{bi}+V)}} \quad (14)$$

The RC time constant can then be obtained by solving the following equations:

$$\text{Re}(Z_s) + \text{Re}(Z') - \frac{1}{\omega C} = 0 \quad (15)$$

$$\tau_{RC} = \frac{2\pi}{\omega}. \quad (16)$$

In the example beam bending structure, the surface area of the substrate on the groove region is A=14.2 μm×3.3 μm. To the first order of approximation, choose r'=3.86 μm in the calculation to represent a substrate of the same area. The RC time constant is plotted against the radius r in FIG. 11.

Figure 11:
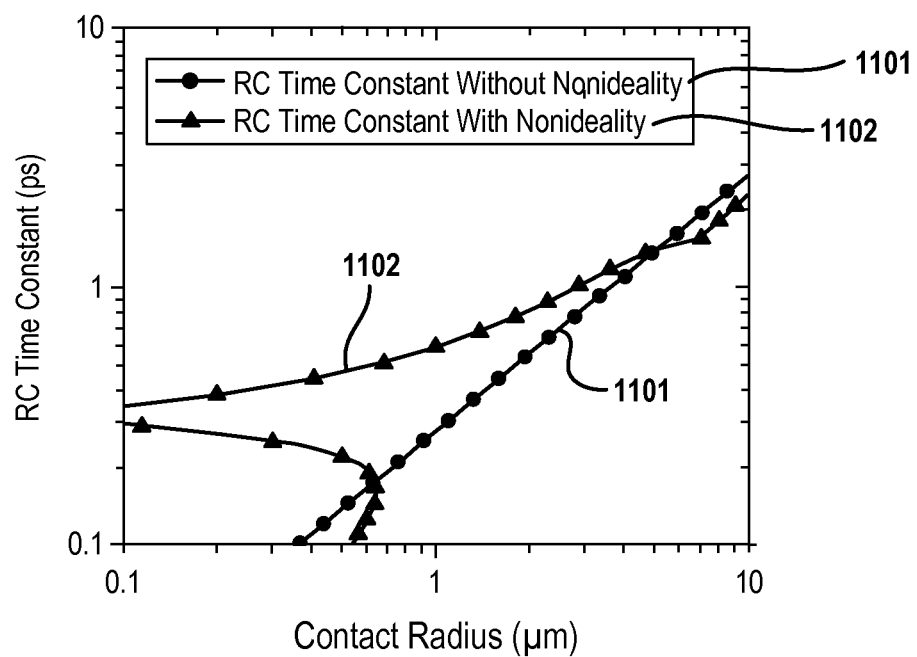
FIG. 11 is a graph depicting an RC time constant as a function of Schottky contact radius.

In FIG. 11, the RC time constant increases proportionally with the Schottky contact radius when skin effect, carrier inertia, and displacement current are not considered in the calculation as indicated as 1101. In real-world scenarios, however, those nonideality factors can have a significant influence on the characteristic impedance of the contact as indicated at 1102, and RC time constant is seen to deteriorate greatly from the ideal case when it is close to the plasmonic resonance frequency of GaAs. In this case, $\tau_{RC}$ is reasonably far from such resonance with the Schottky contact having the same area as the substrate and is calculated to be 1.2 ps.

Taking both $\tau_{trans}$ and $\tau_{RC}$ back into (7), the maximum operating speed of our ADC is estimated to be 63.7 GS/s. It is noted that both the carrier transit time and the RC time constant can be further reduced by incorporating higher initial doping concentration of the n-GaAs region, which will feature smaller device dimensions as well as a thinner space-charge region.

Figure 12:
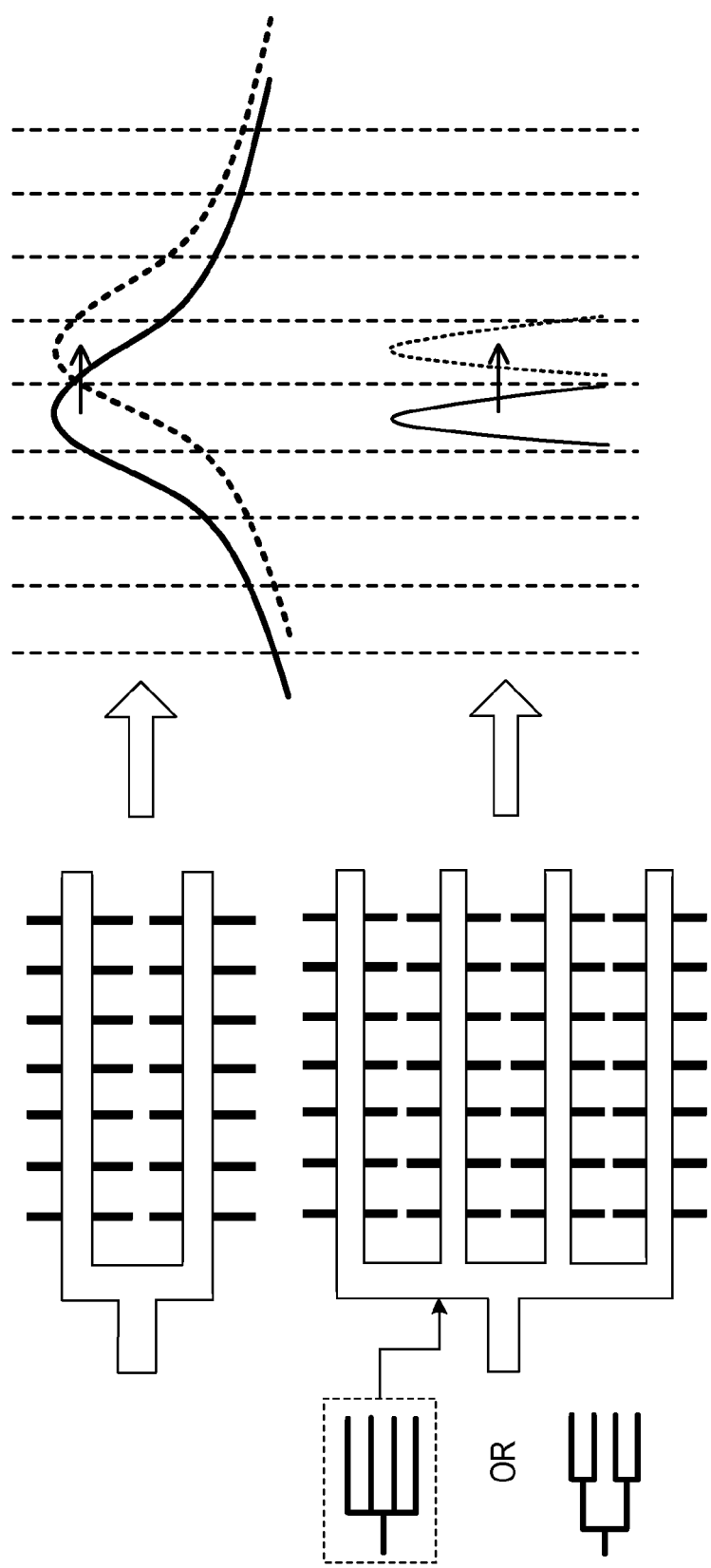
FIG. 12 is diagram of a DC-SSPP beam bender structure having an increased number of interfering arms.
Figure 13:
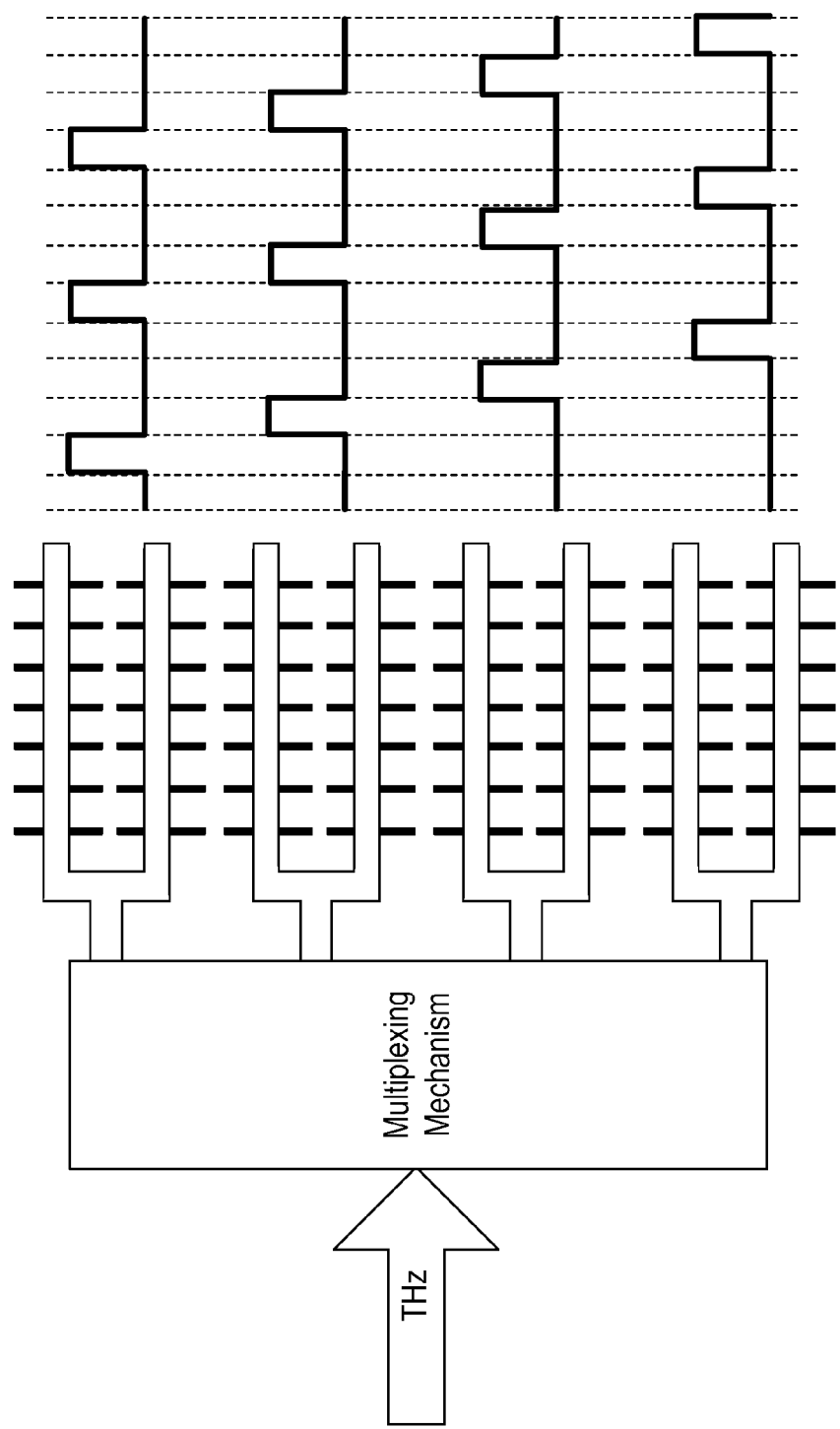
FIG. 13 is a diagram illustrating a temporal interleaving technique for increasing sampling frequency of the ADC.
Figure 14:
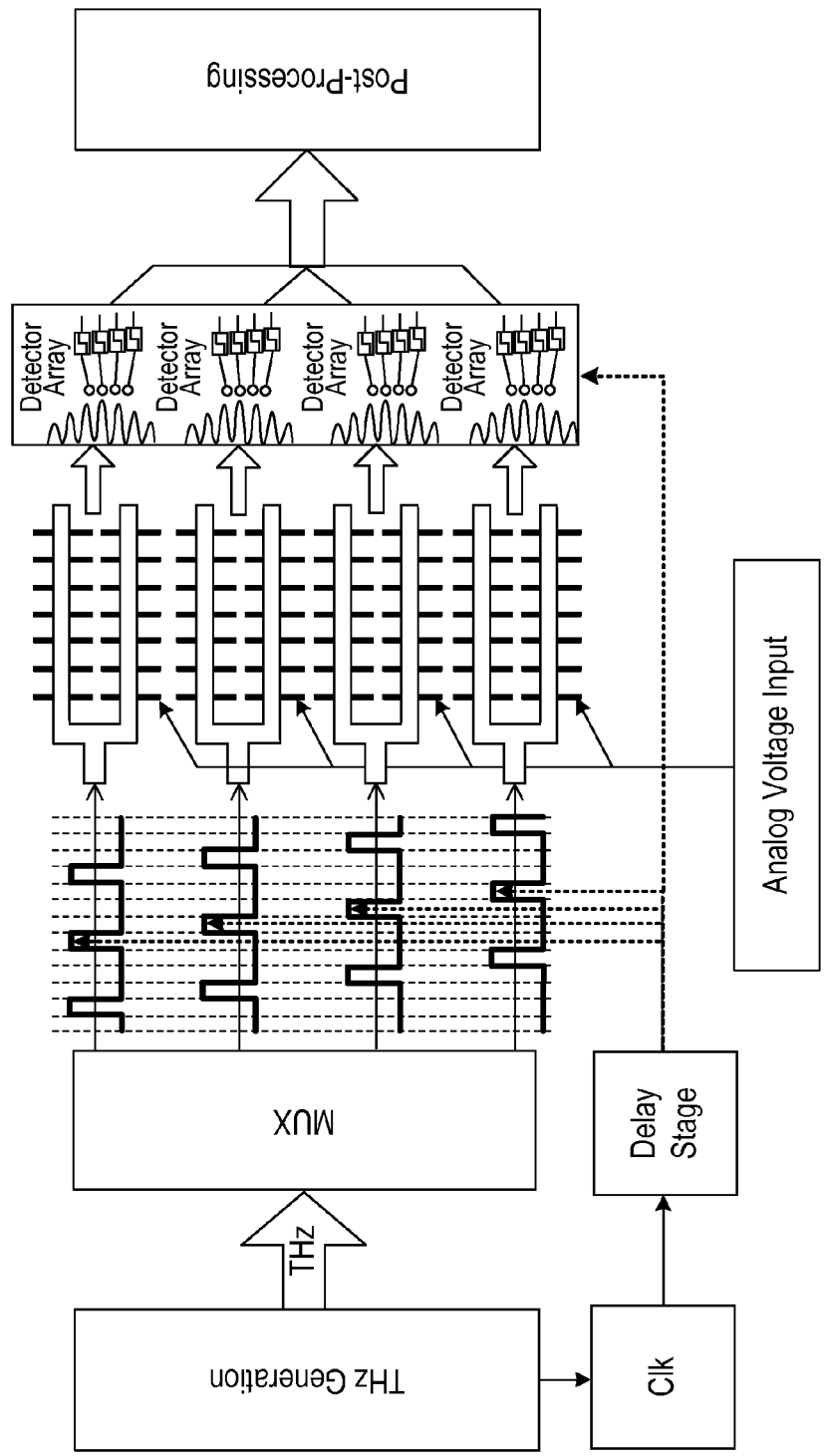
FIG. 14 is a diagram depicting an example ADC arrangement employing the temporal interleaving technique.

In variants of these concepts, ADC bit resolution can be increased by adding interference arms to the beam bending structure as shown in FIG. 12. Moreover, sampling frequency can be further increased by using the concept of temporal interleaving as shown in FIG. 13. As illustrated, the sampling rate can be increase by more than four times. By scaling the temporal interleaving structure, it is envisioned that the sampling frequency can be increased even more. These techniques can lead to a ADC with very high sampling rates and an implementation of 250 to 500 GS/s as shown in FIG. 14.

In this disclosure, a terahertz beam steering structure is designed utilizing SSPP mode E-M propagation through the doubly-corrugated closed waveguide having sub-wavelength dimensions. The SSPP mode propagation is further enhanced by adding a thin layer of doped n-GaAs on the groove walls of the waveguide. The modulation to the free carrier concentration of GaAs causes the change in phase for the propagating terahertz wave, which, by combining two corrugated waveguides to construct an interferometer, can induce significant deflection of the output beam.

The beam bender can operate in either the enhancement mode or the depletion mode, depending on the nature of the free carrier density modulation. In the enhancement mode, free carriers are injected thermally, optically, or electronically into the GaAs layer. In the depletion mode, free carriers are extracted from the semiconductor via an external voltage across the Schottky contact. In both cases, the radiation angle of the output is effectively modulated. The visible nonlinear change of the diversion angle can be effectively corrected when differential controls are applied to the double arms of the MZI structure. The dielectric constant of the GaAs varies with its free carrier concentration as well as frequency. As a result, for both operating modes, different combinations of the two parameters can be used to optimize the design, making it highly adaptable to various applications.

In an effort to achieve higher operating speed for analog-to-digital conversion, the SSPP beam bender is utilized in a spatial-resolved binary encoded sensor array with terahertz response time. With a differential voltage input asserted to both the arms of the MZI, a symmetric deflection angle change as large as ±20° is achieved with nearly perfect linearity. Due to the beam steering effect being realized with only two interferometric branches, the far-field radiation pattern is not suitable for coupling into independent detectors. As a result, detectors with carefully designed gains and saturation powers are used in order to readout multiple bits. By employing the beam deflector operating in depletion mode, a 3-bit ADC is realized with the speed of operation exceeding 60 GS/s. The maximum speed of the device is limited by the drifting carrier transit time across the space-charge region, as well as the parasitic RC constant of the Schottky contact. These time constants can be potentially minimized with a higher initial doping concentration of the n-GaAs that will further boost the operating BW of the proposed ADC design.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. An analog-to-digital converter, comprising:
an interferometer having an input and two arms comprised of a semiconductor material, wherein the input is configured to receive a carrier signal and each arm is configured to guide a spoofed surface plasmon polariton wave from one end of the arm to the free end of the arm, such that the spoofed surface plasmon polariton waves propagates at a speed slower than the carrier signal and are emitted from the free end of each arm into a propagation space and combine in the propagation space to form an interference wave;
a modulator interfaced with the interferometer and operable to modulate the carrier signal in at least one of the two arms with a modulating signal, where the modulating signal has an amplitude in a predefined range of values and the radiation pattern of the interference wave in a far field of the propagation space is shifted in accordance with the amplitude of the modulating signal; and
an array of detectors spatially separated from the interferometer by the propagation space and arranged to receive the interference wave.

2. The analog-to-digital converter of claim 1 wherein the input of the interferometer is configured to receive a carrier signal having a frequency in range of 100 gigahertz to 30 terahertz.

3. The analog-to-digital converter of claim 1 wherein the two arms are encased in metal, thereby forming an interface in each arm along which the spoofed surface plasmon polariton waves travels along.

4. The analog-to-digital converter of claim 3 wherein a first arm of the two arms having a plurality of protrusions formed along a longitudinal dimension at periodic intervals and extending outwardly from the first arm, and a second arm of the two arms having a plurality of protrusions formed along a longitudinal dimension at periodic intervals and extending outwardly from the second arm.

5. The analog-to-digital converter of claim 4 wherein the plurality of protrusions extending from the first arm and the second arm are comprised of the semiconductor material and the semiconductor material in the plurality of protrusions is doped.

6. The analog-to-digital converter of claim 1 wherein the semiconductor material is gallium arsenide.

7. The analog-to-digital converter of claim 1 wherein the modulator operates to change concentration of free carriers in the semiconductor material in at least one of the two arms and thereby change refractive index of the semiconductor material.

8. The analog-to-digital converter of claim 1 wherein the modulator operates to inject free carriers into the semiconductor material.

9. The analog-to-digital converter of claim 1 wherein the modulator operates to inject free carriers into the semiconductor material of both of the two arms, such that the modulating signal is phase shifted 180 degrees between the two arms.

10. The analog-to-digital converter of claim 1 wherein the modulator operates to deplete free carriers into the semiconductor material.

11. The analog-to-digital converter of claim 1 wherein the modulator is further defined as a voltage source electrically coupled to a contact formed on an exterior surface of the interferometer.

12. The analog-to-digital converter of claim 1 wherein the detectors in the array of detectors positioned adjacent to each other, such that each detector is configured to receive an interference wave as caused by a modulating signal having a different amplitude.

13. The analog-to-digital converter of claim 12 wherein the detectors operate in a saturated condition.

14. The analog-to-digital converter of claim 1 wherein the modulator operates to change the concentration of free carriers by applying a modulating signal to both of the arms, such that the modulating signal is phase shifted 180 degrees between the two arms.

15. An analog-to-digital converter, comprising:
an interferometer having an input configured to receive a carrier signal and two arms extending away from the input in parallel with each other, wherein the two arms are comprised of a semiconductor material and encased in metal, thereby forming an interface in each arm along which a spoofed surface plasmon polariton waves travels and is emitted at a free end of each arm into a propagation space;
a modulator interfaced with the interferometer and operable to change concentration of free carriers in the semiconductor material in at least one of the two arms; and
an array of detectors spatially separated from the interferometer by the propagation space and arranged to receive an interference wave formed in the propagation space from the spoofed surface plasmon polariton waves, wherein the detectors in the array of detectors positioned adjacent to each other, such that each detector is configured to receive an interference wave having a maximum value as caused by a modulating signal having a different amplitude.

16. The analog-to-digital converter of claim 15 wherein the input of the interferometer is configured to receive a carrier signal having a frequency in range of 100 gigahertz to 30 terahertz.

17. The analog-to-digital converter of claim 15 wherein each arm includes a first subset of protrusions extending inward towards the other arm and a second subset of protrusions extending in an opposite direction away from the other arm.

18. The analog-to-digital converter of claim 17 wherein the semiconductor material comprising the plurality of protrusions is doped.

19. The analog-to-digital converter of claim 15 wherein the modulator operates to either inject or deplete free carriers into the semiconductor material.

20. The analog-to-digital converter of claim 15 wherein the modulator is further defined as a voltage source electrically coupled to a contact formed on an exterior surface of the interferometer.

21. The analog-to-digital converter of claim 15 wherein the detectors operate in a saturated condition.

22. An analog-to-digital converter, comprising:
an interferometer having an input configured to receive an electromagnetic wave and two arms extending away from the input in parallel with each other, wherein each arm includes a first subset of protrusions extending inward towards the other arm and a second subset of protrusions extending in an opposite direction away from the other arm and wherein the two arms are comprised of a semiconductor material which is encased in metal;
a modulator interfaced with the interferometer and operable to change concentration of free carriers in the semiconductor material in at least one of the two arms; and
an array of detectors spatially separated from the interferometer by the propagation space and arranged to receive an interference wave formed in the propagation space from the electromagnetic waves emitted from free end of each arm.

23. The analog-to-digital converter of claim 22 wherein the input of the interferometer is configured to receive a carrier signal having a frequency in range of 100 gigahertz to 30 terahertz.

24. The analog-to-digital converter of claim 22 wherein the semiconductor material comprising the plurality of protrusions is doped.

25. The analog-to-digital converter of claim 22 wherein the modulator operates to either inject or deplete free carriers into the semiconductor material.

26. The analog-to-digital converter of claim 22 wherein the modulator operates to change the concentration of free carriers by applying a modulating signal to both of the arms, such that the modulating signal is phase shifted 180 degrees between the two arms.

27. The analog-to-digital converter of claim 22 wherein the modulator is further defined as a voltage source electrically coupled to a contact formed on an exterior surface of the interferometer.

28. The analog-to-digital converter of claim 22 wherein the detectors in the array of detectors positioned adjacent to each other, such that each detector is configured to receive an interference wave having a maximum value as caused by a modulating signal having a different amplitude.

29. The analog-to-digital converter of claim 28 wherein the detectors operate in a saturated condition.

* * * * *